US012690167B2

(12) United States Patent
Lin

(10) Patent No.: US 12,690,167 B2
(45) Date of Patent: Jul. 21, 2026

(54) SUPPORT STRUCTURE OF HEAT DISSIPATION UNIT

(71) Applicant: ASIA VITAL COMPONENTS CO., LTD., New Taipei City (TW)

(72) Inventor: Qian-Cheng Lin, New Taipei City (TW)

(73) Assignee: ASIA VITAL COMPONENTS CO., LTD., New Taipei City (TW)

( * ) Notice: Subject to any disclaimer, the term of this patent is extended or adjusted under 35 U.S.C. 154(b) by 275 days.

(21) Appl. No.: 18/138,126

(22) Filed: Apr. 24, 2023

(65) Prior Publication Data

US 2023/0422442 A1      Dec. 28, 2023

(30) Foreign Application Priority Data

Jun. 23, 2022      (TW) .................................. 111123473

(51) Int. Cl.
*H05K 7/20* (2006.01)
(52) U.S. Cl.
CPC ................................ *H05K 7/20336* (2013.01)
(58) Field of Classification Search
CPC ............ H05K 7/20309; H05K 7/20336; F28D 15/02; F28D 2015/0216
See application file for complete search history.

(56) References Cited

U.S. PATENT DOCUMENTS 7,609,520 B2 * 10/2009 Chang ................. F28D 15/0233
                                                                165/104.33
9,470,459 B2 * 10/2016 Lin ..................... F28D 15/0233

11,131,508 B2 * 9/2021 Sheng ................. F28D 15/0233
11,566,851 B2 * 1/2023 Kojima .................. C25D 1/003
(Continued)

FOREIGN PATENT DOCUMENTS

CN          101232794 A       7/2008
CN          216017503 U       3/2022
CN          107764117 A       11/2022
(Continued)

OTHER PUBLICATIONS

Search Report dated Apr. 16, 2025 issued by China National Intellectual Property Administration for counterpart application No. 2022107257938.

*Primary Examiner* — Gordon A Jones
(74) *Attorney, Agent, or Firm* — Demian K. Jackson; Jackson IPG PLLC

(57) ABSTRACT

A support structure of heat dissipation unit is applicable in a heat dissipation unit. Two sides of the heat dissipation unit are respectively formed with a condensation side and an evaporation side. Two ends of the support structure respectively abut against and connect with the condensation side and the evaporation side. The support structure includes a base section and a thorny section. The base section has a contact face and a support face. The thorny section is composed of multiple thorny columns arranged on the support face of the base section in an array. The thorny columns are arranged at intervals, whereby a passage is defined between each two adjacent thorny columns. The support structure with the thorny section serves to speed vapor-liquid circulation in the heat dissipation unit and increase flowing speed of the working fluid so as to greatly enhance heat dissipation performance.

9 Claims, 3 Drawing Sheets

(56) References Cited

U.S. PATENT DOCUMENTS

2008/0029249 A1* 2/2008 Hsiao .................... F28D 15/046
165/104.33

FOREIGN PATENT DOCUMENTS

| CN | 217936344 | U | 11/2022 | |
|----|-----------|---|---------|---|
| EP | 3182447 | A1 * | 6/2017 | ......... H05K 7/20336 |
| TW | M265903 | U | 5/2005 | |
| TW | 200518664 | A | 6/2005 | |
| TW | 200832120 | A | 8/2008 | |
| TW | M451521 | U | 4/2013 | |
| TW | 202210780 | A | 3/2022 | |
| TW | M634862 | U | 12/2022 | |
| WO | 2022007032 | A1 | 1/2022 | |

* cited by examiner

SUPPORT STRUCTURE OF HEAT DISSIPATION UNIT

This application claims the priority benefit of Taiwan patent application number 111123473 filed on Jun. 23, 2022.

BACKGROUND OF THE INVENTION

1. Field of the Invention

The present invention relates generally to a heat dissipation unit, and more particularly to a support structure of a heat dissipation unit.

2. Description of the Related Art

Along with rapid advance of sciences and technologies, the power and performance of electronic products have become higher and higher. As a result, the electronic products generate higher heat in operation. In case the heat is not dissipated in time and accumulates on the electronic components (such as central processing unit or graphics processing unit) in the electronic products, the temperature of the electronic components will rise to affect the performance of the electronic components or even lead to malfunction and damage of the electronic components. Therefore, the manufacturers have continuously developed various heat dissipation devices so as to solve the heat dissipation problem of the electronic components. A vapor chamber is one of the most often seen heat dissipation devices.

A conventional vapor chamber is composed of an upper plate and a lower plate. The upper and lower plates are mated with each other to together define a chamber. A working liquid (such as pure water) is filled in the chamber. In addition, a capillary structure and multiple support columns are disposed in the chamber. Two ends of the support columns respectively abut against and connect with the inner sides of the upper and lower plates in the chamber. The upper and lower plates respectively serve as a condensation section and an evaporation side in contact with a heat generation component. When the evaporation section absorbs the heat of the heat generation component, the working liquid in the evaporation section is heated and evaporated into vapor (vapor working fluid). The vapor working fluid flows toward the condensation section. After the vapor working fluid on the condensation section is condensed and converted into liquid (liquid working fluid), due to gravity, the liquid working fluid flows through the support columns back to the evaporation section. The vapor-liquid circulation of the working fluid in the chamber is continuously repeated to dissipate the heat.

However, the conventional support column is a solid copper column, which can simply provide supporting effect, while failing to provide capillary attraction. Therefore, the working fluid can only flow from the condensation section back to the evaporation section under gravity. The back flowing speed is too slow so that dry out of the evaporation section often takes place to lead to poor heat transfer efficiency.

Therefore, some manufacturers have improved the support column, whereby the support column not only can provide supporting effect, but also can provide capillary attraction for the liquid working fluid.

The improved columns with capillary attraction can be substantially classified into three types. The first type of support column is the sintered support column formed of sintered powder. Under the capillary attraction of the capillary structure on the sintered support column, the condensed liquid flows back to the evaporation section. Such sintered support column can provide capillary attraction. However, another problem is derived. That is, at a high temperature of 120 degrees, the vapor pressure of the vapor working fluid is 2 kg/cm$^2$ and the pressure moving direction of the vapor working fluid is irregular. Each sintered support column has irregularly-shaped top face and bottom face so that the drawing force resistible by the connection force between each sintered support column and the inner sides of the upper and lower plates is 1 kg/cm$^2$. As a result, the sintered support column cannot grasp the upper and lower plates and the upper and lower plates will outward swell. In some minor cases, the vapor chamber will bulge. In come serious cases, the vapor chamber will deform to lead to fracture and failure of the support columns.

The second type of support column is a solid copper column body with a sintered powder ring structure fitted therearound. Under the capillary attraction of the sintered powder ring structure on the solid copper column body, the condensed liquid flows back to the evaporation section. This solves the above problem that the sintered support column will lead to swelling of the vapor chamber. However, the total outer diameter of each support column is exactly the outer diameter of the sintered powder ring structure so that the total volume of the support columns is excessively large to occupy too much room in the chamber (seriously affect the capacity of the chamber). As a result, the flowing passage for the vapor is narrowed and relatively, the movable range of the vapor is reduced (minified). Therefore, the resistance against flowing of the vapor is increased so that the vapor-liquid circulation is deteriorated and the heat dissipation efficiency is lowered.

The third type of support column is a solid copper column body formed with multiple channels on the outer surface. Under the capillary attraction of the channels on the outer surface of the solid copper column body, the condensed liquid flows back to the evaporation section. Such support column structure solves the above problems of swelling of the vapor chamber and narrowing of the vapor passage. However, another problem is derived. That is, in practical manufacturing process, the total outer diameter of the solid copper column body must be larger than 5 mm for having sufficient space to form the channels on the outer surface of the solid copper column body. In addition, the number, size and depth of the channels will all affect the capillary intensity (capillary ability). In case that the capillary attraction of the channels is not strong enough, the amount of the water carried back to the evaporation section will be limited and insufficient or even the water cannot flow back to the evaporation section. Under such circumstance, there will be no working fluid in the evaporation section to lead to dry state, (that is, dry out) of the evaporation section. As a result, the heat can be hardly spread and the heat dissipation effect is deteriorated.

It is therefore tried by the applicant to provide a support structure of heat dissipation unit to solve the above problems existing in the conventional support column structure of the vapor chamber.

SUMMARY OF THE INVENTION

It is therefore a primary object of the present invention to provide a support structure of heat dissipation unit, which includes a thorny section. The thorny section is composed of multiple thorny columns instead of the conventional support structure with sintered capillary structure or channels. The thorny columns can speed the vapor-liquid circulation in the heat dissipation unit and increase flowing speed of the working fluid so as to effectively enhance heat dissipation performance of the heat dissipation unit.

It is a further object of the present invention to provide the above support structure of heat dissipation unit, which has better heat spreading effect and can enhance capillary ability of the heat dissipation unit. Also, the total weight of the support structure is reduced and the heat dissipation area is increased.

To achieve the above and other objects, the support structure of heat dissipation unit of the present invention is applicable in a heat dissipation unit (such as a vapor chamber). Two sides of the heat dissipation unit are respectively formed with a condensation side and an evaporation side. Two ends of the support structure respectively abut against and connect with the condensation side and the evaporation side. The support structure includes a base section and a thorny section. The base section has a contact face and a support face. The thorny section is composed of multiple thorny columns arranged on the support face of the base section in an array. The thorny columns are arranged at intervals, whereby a passage is defined between each two adjacent thorny columns. Therefore, not only the support structure can provide supporting effect, but also in precondition that the volume is not increased, the thorny section and the passages between the thorny columns serve to guide the condensed working fluid in the condensation side of the heat dissipation unit to the evaporation side. Therefore, the vapor-liquid circulation is speeded and the flowing speed of the working fluid is increased so as to greatly enhance heat dissipation performance of the heat dissipation unit.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
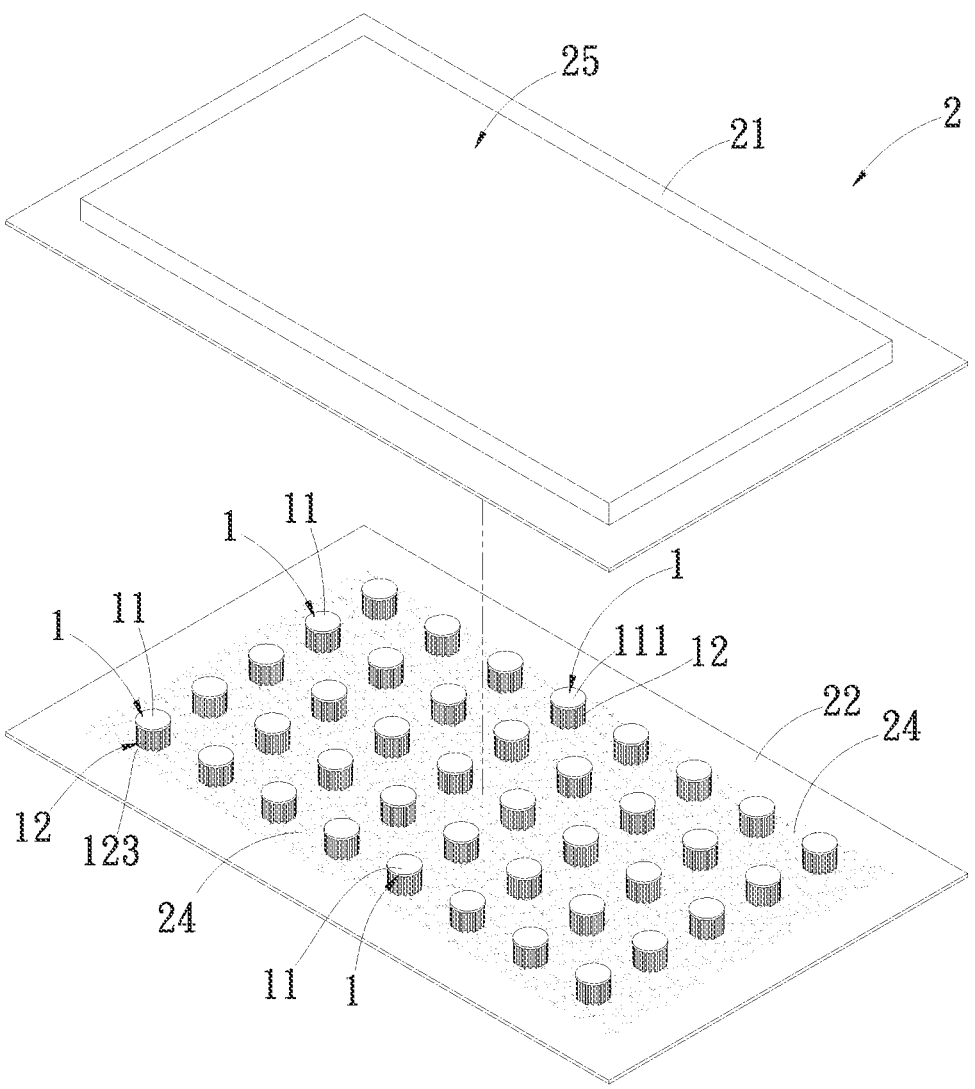
FIG. 1 is a perspective exploded view of the heat dissipation unit of the present invention.
Figure 2:
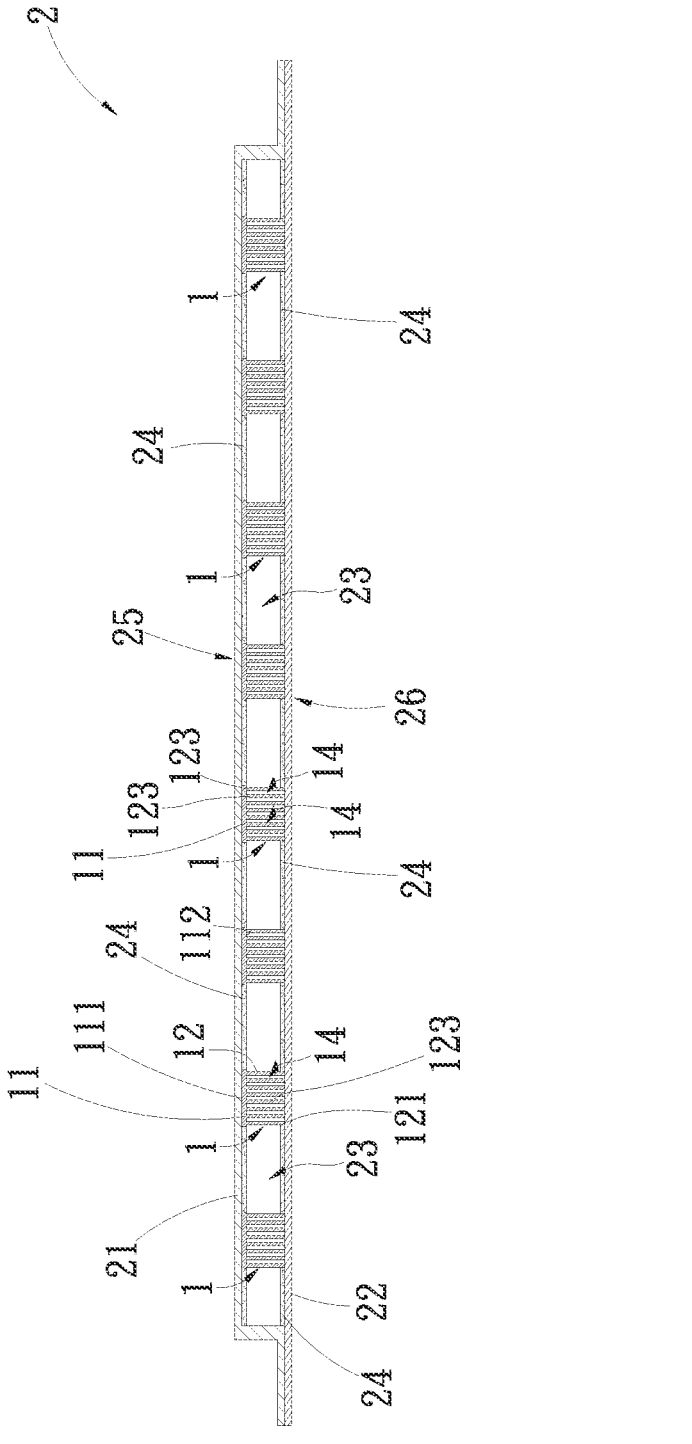
FIG. 2 is a sectional assembled view of the heat dissipation unit of the present invention.

Please refer to FIGS. 1 and 2. The support structure 1 of heat dissipation unit of the present invention is applicable in a heat dissipation unit 2. The heat dissipation unit 2 is such as a vapor chamber, a heat plate, a flat-plate heat pipe or a cold plate. In this embodiment, the heat dissipation unit 2 is, but not limited to, a vapor chamber for illustration.

The heat dissipation unit 2 includes an upper plate 21 and a lower plate 22. The upper and lower plates 21, 22 are mated with each other to together define a chamber 23. A working fluid (such as pure water, inorganic compound, alcohol, liquid metal, coolant, organic compound or a mixture) is filled in the chamber 23. In addition, a capillary structure 24 is disposed on inner wall of the chamber 23. The capillary structure 24 is selected from a group consisting of sintered powder body, channels, mesh body, fiber body and woven body. In this embodiment, the capillary structure 24 is selectively a sintered powder body formed on inner sides of the upper and lower plates 21, 22 in the chamber 23. The upper and lower plates 21, 22 are respectively formed with a condensation side (condensation section) 25 and an evaporation side (evaporation section) 26. The outer side of the lower plate 26 of the evaporation side 26 is indirectly or directly in contact with a heat generation component (such as a central processing unit, a graphics card chip, Southbridge and Northbridge chipset or other electronic component (such as a transistor)) to absorb the heat generated by the heat generation component.

Figure 3A:
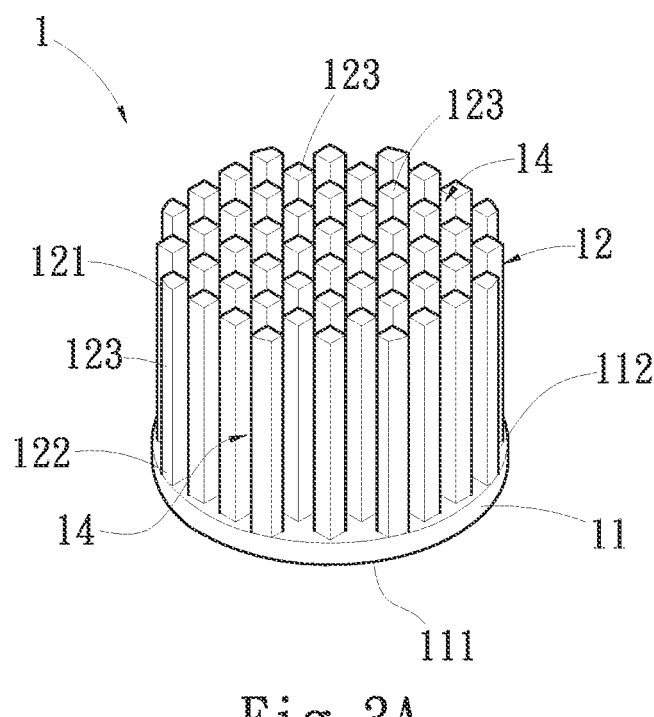
FIG. 3A is a perspective view of the support structure of the present invention.
Figure 3B:
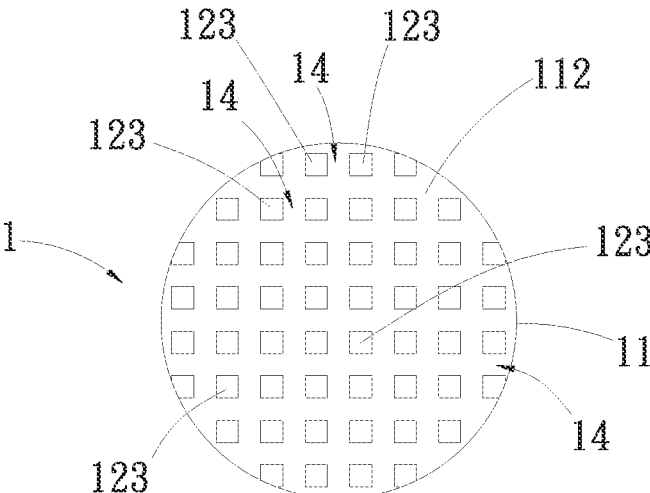
FIG. 3B is a top view according to FIG. 3A.

Please refer to FIGS. 2, 3A and 3B. In this embodiment, there are multiple support structures 1 disposed in the chamber 23 of the heat dissipation unit 2. The support structures 1 not only provide support effect, but also provide better capillary attraction and high infiltration rate. In the present invention, the number of the support structures 1 is not limited to the number as shown in the drawings. In practice, the number of the support structures 1 can be designed and adjusted in accordance with the necessary support strength and power value of the heat dissipation unit 2.

To speak more specifically, each support structure 1 is a column body made of metal material with high heat conductivity, such as copper, silver, aluminum or an alloy thereof. In addition, each support structure 1 has a base section 11 and a thorny section 12.

The base section 11 has a contact face 111 and a support face 112 respectively positioned on two sides of the base section 11. The contact face 111 of the base section 11, (that is, one end of the support structure 1), is in contact with the condensation side 25 or the evaporation side 26 of the heat dissipation unit 2. In this embodiment, the contact face 111 of the base section 11 is in connection with and in contact with the inner side of the upper plate 21 of the chamber 23 in adjacency to the capillary structure 24. In addition, the thorny section 12 is disposed on the support face 112 of the base section 11. The thorny section 12 is composed of multiple thorny columns 123 arranged in an array. That is, the thorny columns 123 of the thorny section 12 are distributed on the support face 112 of the base section 11 and alternately or side by side arranged at intervals in an array. In addition, referring to FIG. 3B, in this embodiment, the base section 11 is, but not limited to, a block body with a circular cross section. Alternatively, the base section 11 can be a block body (or a plate body or a column body) with a rectangular or polygonal cross section.

The thorny section 12 is integrally or non-integrally disposed on the support face 112 of the base section 11. In this embodiment, the thorny columns 123 of the thorny section 12 are fin columns integrally formed on the support face 112 of the base section 11. The thorny section 12 has a free end 121 and a fixed end 122 respectively positioned at two ends of the thorny section 12. The fixed end 122 is fixedly connected with the support face 112 of the base section 11 and positioned in adjacency to the condensation side 25 or the evaporation side 26. The free end 121, (that is, the other end of the support structure 1), outward protrudes from the base section 11 into (not into) contact with the adjacent evaporation side 26 or the condensation side 25. In this embodiment, the free end 121 of the thorny section 12, (that is, the free ends of the thorny columns 123), are in connection with and in contact with the inner side of the lower plate 22 of the chamber 23 of the evaporation side 26 in connection with the adjacent capillary structure 24. In this embodiment, the thorny columns 123 of the thorny section 12 are, but not limited to, cylindrical copper column bodies with a circular cross section for illustration. Alternatively, the thorny columns 123 can be column bodies (plate bodies) with a rectangular, triangular or polygonal cross section. Also, the base section 11 and the thorny section 12 are made of metal material with high heat conductivity.

The thorny columns 123 of the thorny section 12 are arranged at intervals so that a passage 14 is defined between each two adjacent thorny columns 123 in communication with the chamber 23 of the heat dissipation unit 2. In addition, each passage 14 on the support face 112 of the base section 11 has a width ranging from 0.1 mm to 0.25 mm. The widths of the passages 14 between the thorny columns 123 are equal to or unequal to each other. For example, the thorny columns 123 are arranged on the support face 112 of the base section 11 at equal intervals so that the passages 14 have equal widths. Alternatively, the thorny columns 123 are arranged on the support face 112 of the base section 11 at unequal intervals so that the widths of the passages 14 are gradually outward narrowed or widened.

To speak more specifically, in this embodiment, the thorny columns 123 of the thorny section 12 are integrally formed on the support face 112 of the base section 11 by means of mechanical processing (linear cutting or CNC processing) or laser cutting. In addition, the passages 14 between the adjacent thorny columns 123 have equal widths (such as 0.1 mm). According to such arrangement, the thorny columns 123 can speed the evaporation of the working fluid on the evaporation side 26 of the heat dissipation unit 2. Moreover, the passages 14 between the adjacent thorny columns 123 serve to guide (induct) the working fluid as the capillary attraction for absorbing the condensed working fluid under capillarity. Also, the widths of the passages 14 range from 0.1 mm to 0.25 mm. This design can achieve better infiltration rate, whereby the liquid working fluid can quickly flow back to the evaporation side 26 so as to increase flowing speed and speed the vapor-liquid circulation. Therefore, the heat dissipation performance is effectively enhanced.

Please refer to FIG. 2 again. When the evaporation side 26 of the heat dissipation unit 2 absorbs the heat of the heat generation component, the working fluid on the capillary structure 24 in the evaporation side 26 is heated and converted into vapor working fluid. The vapor working fluid will quickly flow within the chamber 23 and the passages 14 between the thorny columns 123 toward the inner side of the upper plate 21 of the condensation side 25. After the vapor working fluid on the condensation side 25 is condensed and converted into liquid working fluid, the liquid working fluid on the capillary structure 24 of the inner side of the upper plate 21 will be immediately guided (conducted) by the thorny section 21 of the support structure 1 and the passages 14 and transferred back to the capillary structure 24 of the inner side of the lower plate 22 of the evaporation side 26. Accordingly, the vapor-liquid circulation of the working fluid in the chamber 23 of the heat dissipation unit 2 is speeded. The vapor-liquid circulation of the working fluid is continuously repeated to dissipate the heat so that the vapor-liquid circulation efficiency of the entire heat dissipation unit 2 is enhanced to achieve better heat-spreading and temperature-lowering effect. Also, the problem of dry out of the evaporation side 26 is avoided.

In this embodiment, no heat dissipation component is, but not limited to, disposed on the outer side of the upper plate 21 of the condensation side of the heat dissipation unit 2. In a modified embodiment, a radiating fin assembly composed of multiple radiating fins is disposed on the outer side of the upper plate 21 of the condensation side 25 so as to enlarge heat dissipation area.

In this embodiment, the thorny columns 123 of the thorny sections 12 of the support structures 1 are, but not limited to, disposed on the base section 11. In a modified embodiment, the base section 11 includes multiple micro-base sections. At least one thorny column 123 is disposed on the support face of each micro-base section. The micro-base sections are assembled with each other (by means of such splicing, engagement or welding) to together form the support structure 1.

In this embodiment, the support structures 1 are, but not limited to, upside-down disposed in the chamber 23 of the heat dissipation unit 2 (as shown in FIG. 2), whereby the contact faces 111 of the base sections 11 and the free ends 121 of the thorny sections 12 respectively contact the condensation side 25 and the evaporation side 26 of the heat dissipation unit 2. In a modified embodiment, the support structures 1 are upright disposed in the chamber 23 of the heat dissipation unit 2, whereby the contact faces 111 of the base sections 11 and the free ends 121 of the thorny sections 12 respectively contact the evaporation side 26 and the condensation side 25 of the heat dissipation unit 2. Alternatively, some of the support structures 1 are upright disposed, while some others of the support structures 1 are upside-down alternately disposed (distributed) in the chamber 23 of the heat dissipation unit 2.

In the present invention, the support structures 1 with the thorny sections 12 and the passages 14 are arranged in the heat dissipation unit 2. Such design can be effectively used instead of (substitute for) the conventional copper columns with sintered capillary structures 24 or channels. In precondition that the volume is not increased, the total weight of the support structures 1 is reduced and the flowing space for the vapor (vapor working fluid) in the chamber 23 is enlarged. Therefore, the evaporation efficiency in the heat dissipation unit 2 is greatly enhanced. Also, the capillary attraction and the infiltration rate necessary for the condensed liquid working fluid are increased. Accordingly, the heat dissipation performance of the entire heat dissipation unit 2 is enhanced.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A support structure of a heat dissipation unit, the heat dissipation unit having an upper plate and a lower plate together defining a chamber and having a first and a second capillary structure arranged on inner surfaces of the upper and lower plates respectively, wherein two sides of the heat dissipation unit are respectively formed with a condensation side and an evaporation side, the support structure having two ends respectively abutting against and connecting with the condensation side and the evaporation side, the support structure comprising a base section and a thorny section, the base section having a contact face directly contacting the first capillary structure and a support face, the thorny section being composed of multiple thorny columns arranged on the support face of the base section in an array and each of the multiple thorny columns being arranged at intervals, whereby a passage is defined between each two adjacent thorny columns of the multiple thorny columns and each of the multiple thorny columns extending from the support face of the base section toward the lower plate and having a free end directly in contact with the second capillary structure and an opposite fixed end fixedly connected with the support face of the base section, the thorny section serving to speed vapor-liquid circulation and increase flowing speed of the working fluid so as to enhance heat dissipation performance.

2. The support structure of claim 1, wherein each thorny column of the multiple thorny columns is integrally disposed on the support face of the base section.

3. The support structure of claim 1, wherein each thorny column of the multiple thorny columns is arranged on the support face of the base section at equal intervals.

4. The support structure of claim 1, wherein each thorny column of the multiple thorny columns is side by side disposed on the support face of the base section at intervals in an array.

5. The support structure of claim 1, wherein the base section and the thorny section are made of a material with high heat conductivity.

6. The support structure of claim 1, wherein the heat dissipation unit is a vapor chamber.

7. The support structure of claim 1, wherein the widths of the passages between each thorny column of the multiple thorny columns are equal to each other.

8. The support structure of claim 1, wherein a working fluid is filled in the chamber, the passages of the thorny section being in communication with the chamber, the upper and lower plates respectively serving as the condensation side and the evaporation side.

9. A support structure of a heat dissipation unit, the heat dissipation unit comprising an upper plate and a lower plate, the upper plate and the lower plate together defining a chamber, inner surfaces of the upper plate and the lower plate facing the chamber being respectively provided with a first capillary structure and a second capillary structure, two sides of the heat dissipation unit being respectively formed with a condensation side and an evaporation side, the support structure having two ends respectively abutting against and connecting with the condensation side and the evaporation side, the support structure comprising a base section and a thorny section, the base section having a support face, the base section directly contacting the second capillary structure, the thorny section being composed of multiple thorny columns arranged on the support face of the base section in an array, each of the multiple thorny columns being elongated and arranged at intervals, whereby a passage is defined between each two adjacent thorny columns of the multiple thorny columns, the thorny section extending from the base section toward the upper plate and having a free end directly contacting the first capillary structure and an opposite fixed end fixedly connected with the support face of the base section, the thorny section serving to speed vapor-liquid circulation and increase flowing speed of the working fluid so as to enhance heat dissipation performance.

* * * * *